(12) United States Patent
Filion et al.

(10) Patent No.: US 12,249,540 B1
(45) Date of Patent: Mar. 11, 2025

(54) MANAGING TRENCH DEPTH IN INTEGRATED SYSTEMS

(71) Applicant: Ciena Corporation, Hanover, MD (US)

(72) Inventors: Benoît Filion, Lévis (CA); Charles Baudot, Quebec (CA); François Pelletier, Quebec (CA); Christine Latrasse, Quebec (CA)

(73) Assignee: Ciena Corporation, Hanover, MD (US)

( * ) Notice: Subject to any disclaimer, the term of this patent is extended or adjusted under 35 U.S.C. 154(b) by 625 days.

(21) Appl. No.: 17/574,162

(22) Filed: Jan. 12, 2022

Related U.S. Application Data (62) Division of application No. 16/897,865, filed on Jun. 10, 2020, now Pat. No. 11,227,790.

(60) Provisional application No. 62/859,955, filed on Jun. 11, 2019.

(51) Int. Cl.

| | | |
|---|---|---|
| *H01L 21/76* | (2006.01) | |
| *G02B 6/136* | (2006.01) | |
| *H01L 21/308* | (2006.01) | |
| *H01L 21/762* | (2006.01) | |
| *B81C 1/00* | (2006.01) | |
| *G02B 6/12* | (2006.01) | |
| *H01L 21/306* | (2006.01) | |
| *H01L 21/3065* | (2006.01) | |

(52) U.S. Cl.
CPC ........ *H01L 21/76229* (2013.01); *G02B 6/136* (2013.01); *H01L 21/3085* (2013.01); *H01L 21/76283* (2013.01); *B81C 1/00412* (2013.01); *G02B 2006/12176* (2013.01); *H01L 21/30604* (2013.01); *H01L 21/3065* (2013.01)

(58) Field of Classification Search
CPC ........... H01L 21/76229; H01L 21/3085; H01L 21/76283; H01L 21/30604; H01L 21/3065; G02B 6/136; G02B 2006/12176; B81C 1/00412
See application file for complete search history.

(56) References Cited

U.S. PATENT DOCUMENTS

| | | | |
|---|---|---|---|
| 6,025,276 A | 2/2000 | Donohoe et al. | |
| 6,926,841 B2 | 8/2005 | O'Brien | |
| 7,792,403 B1 * | 9/2010 | Little | G02B 6/1228 385/11 |

(Continued)

FOREIGN PATENT DOCUMENTS

JP          S62-247539 A      10/1987

*Primary Examiner* — Peter Radkowski
(74) *Attorney, Agent, or Firm* — Young Basile Hanlon & MacFarlane, P.C.

(57) ABSTRACT

One or more photonic structures are formed within one or more layers over a surface of a substrate, and multiple trenches are formed through the one or more layers housing devices coupled to one or more of the photonic structures. The trenches may include: a first trench that has a bottom surface within the substrate that has a first surface topology characterized by a first surface roughness at a first depth within the substrate relative to the surface of the substrate, and a second trench that has a bottom surface within the substrate that has a second surface topology characterized by a second surface roughness at a second depth within the substrate relative to the surface of the substrate. The first surface roughness may be greater than the second surface roughness, and the second depth may be greater than the first depth.

14 Claims, 8 Drawing Sheets

(56) References Cited

U.S. PATENT DOCUMENTS

| | | | |
|---|---|---|---|
| 8,877,616 B2* | 11/2014 | Pinguet | H01L 21/84 |
| | | | 257/351 |
| 8,948,549 B2* | 2/2015 | Picard | G02B 6/1228 |
| | | | 385/11 |
| 9,645,312 B2* | 5/2017 | Barwicz | G02B 27/283 |
| 9,823,419 B1 | 11/2017 | Pelletier et al. | |
| 2008/0267239 A1* | 10/2008 | Hall | H01S 5/22 |
| | | | 438/38 |
| 2010/0059822 A1* | 3/2010 | Pinguet | H01L 27/1203 |
| | | | 257/351 |
| 2013/0343705 A1* | 12/2013 | Vermeulen | G02B 6/126 |
| | | | 385/37 |
| 2014/0153862 A1* | 6/2014 | Picard | G02B 6/126 |
| | | | 385/11 |
| 2014/0254333 A1* | 9/2014 | Komura | H01P 3/122 |
| | | | 369/13.17 |
| 2014/0355979 A1* | 12/2014 | Dorin | G02F 1/2257 |
| | | | 398/27 |
| 2015/0003782 A1* | 1/2015 | Oka | G02B 6/2821 |
| | | | 385/42 |
| 2016/0178841 A1* | 6/2016 | Oka | G02B 6/126 |
| | | | 385/11 |
| 2016/0336417 A1 | 11/2016 | Hsiao et al. | |
| 2017/0023735 A1* | 1/2017 | Barwicz | G02B 6/2773 |
| 2017/0123154 A1* | 5/2017 | Doerr | G02B 6/126 |
| 2017/0131472 A1* | 5/2017 | Kobyakov | G02B 6/305 |
| 2017/0139136 A1* | 5/2017 | Oka | G02B 6/14 |

\* cited by examiner

MANAGING TRENCH DEPTH IN INTEGRATED SYSTEMS

CROSS-REFERENCE TO RELATED APPLICATION(S)

This application is a divisional of U.S. patent application Ser. No. 16/897,865, filed Jun. 10, 2020, which claims priority to and the benefit of U.S. Provisional Application Patent Ser. No. 62/859,955, filed Jun. 11, 2019, each of which is incorporated herein in its entirety by reference.

TECHNICAL FIELD

This disclosure relates to managing trench depth in integrated systems.

BACKGROUND

Trenches are sometimes formed during the fabrication of certain integrated circuits, including during some processes for fabricating a Silicon photonic (SiPhot) integrated circuit. For example, a trench may be etched during a back-end-of-line (BEOL) process where a SiPhot die is etched all the way to a silicon substrate, which in some cases may be under a buried oxide (BOX) layer that is present in some wafers used in a silicon-on-insulator (SOI) fabrication process for fabricating SiPhot dies.

SUMMARY

In one aspect, in general, an article of manufacture may include one or more photonic structures formed within one or more layers over a surface of a substrate, and multiple trenches formed through the one or more layers housing devices coupled to one or more of the photonic structures. The trenches may include: a first trench that has a bottom surface within the substrate that has a first surface topology characterized by a first surface roughness at a first depth within the substrate relative to the surface of the substrate, and a second trench that has a bottom surface within the substrate that has a second surface topology characterized by a second surface roughness at a second depth within the substrate relative to the surface of the substrate. The first surface roughness may be greater than the second surface roughness, and the second depth may be greater than the first depth.

Aspects can include one or more of the following features.

The first surface may include a first set of regions that have been etched more deeply than a second set of regions.

The substrate consists essentially of Silicon.

The one or more photonic structures comprise a plurality of photonic structures.

The one or more photonic structures comprise one or more waveguides.

At least one waveguide is formed in proximity to at least one of the first trench or the second trench.

At least one of the photonic structures is formed from etched Silicon deposited in a layer over the surface of the substrate.

At least one of the photonic structures is formed from Germanium epitaxy.

In another aspect, in general, a method for fabricating a photonic integrated circuit may include: forming multiple structures within one or more layers deposited over a substrate, the substrate consisting essentially of a first material characterized by a first etching rate; forming multiple trenches through the one or more layers. The trenches may include: a first trench that has a bottom surface on or within the substrate that is covered by a layer of a second material characterized by a second etching rate lower than the first etching rate, and a second trench that has a bottom surface on or within the substrate. The method may also include etching two or more trenches of the multiple trenches simultaneously, including at least the first trench and the second trench, to deepen each of the two or more trenches, where the etching removes all of the second material from any of the bottom surfaces of the two or more trenches that were covered by a layer of the second material.

Aspects can include one or more of the following features.

The bottom surface of the second trench is not covered by a layer of the second material.

After the simultaneous etching, the second trench may be deeper than the first trench.

A thickness of the layer of the second material may be selected to provide approximately a predetermined ratio between a depth of the first trench and a depth of the second trench.

In another aspect, in general, a method for fabricating a photonic integrated circuit may include: forming a plurality of structures within one or more layers deposited over a substrate, the substrate consisting essentially of a first material characterized by a first etching rate; forming a plurality of trenches through the one or more layers, the plurality of trenches including: a first trench that has a bottom surface on or within the substrate that is covered by a layer of a second material characterized by a second etching rate lower than the first etching rate, and a second trench that has a bottom surface on or within the substrate; etching two or more trenches of the plurality of trenches simultaneously, including at least the first trench and the second trench, to deepen each of the two or more trenches, where the etching preserves at least a portion of the second material on any of the bottom surfaces of the two or more trenches that were covered by a layer of the second material; removing the preserved portion of the second material on any of the bottom surfaces of the two or more trenches that were covered by a layer of the second material; and after removing the preserved portion of the second material, etching two or more trenches of the plurality of trenches simultaneously, including at least the first trench and the second trench, to deepen each of the two or more trenches.

Aspects can include one or more of the following features.

The bottom surface of the second trench is not covered by a layer of the second material.

After the simultaneous etching that occurs after the preserved portion of the second material is removed, the second trench is deeper than the first trench.

A thickness of the layer of the second material is selected to provide approximately a predetermined ratio between a depth of the first trench and a depth of the second trench.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Trenches may be formed for a variety of reasons, including for example, to provide dicing lanes for the separation of a semiconductor wafer (e.g., a silicon wafer) into multiple dies. Additionally, the surface quality of the trench may enable the efficient coupling of the light in and/or out of the SiPhot die. A trench can be also useful for many other applications such as optical crosstalk mitigation, thermal crosstalk mitigation, and the co-integration of multi-platform opto-electrical dies. For example, trenches could be used to integrate InP-based components (e.g., lasers, optical amplifiers, optical modulators, optical filters), LiNbO3-based components (e.g., modulators, optical modulators), free-space optics components (e.g., optical isolators, optical circulators, optical filters), or even another SiPhot die.

Different applications, including the applications mentioned above, may use trenches with different depths, however, there are challenges associated with fabricating such SiPhot dies with trenches of varying depths. For the purposes of some of the examples described herein, an application of interest will be one for which a deep trench (DT) will be formed having a first depth relative to the surface of the substrate (e.g., 120 microns deep) and a shallow trench (ST) will be formed having a second depth relative to the surface of the substrate (e.g., 40 microns deep). However, other examples may include more than two different depths of trenches, and/or depths that are considered to be at intermediate depths between "shallow" trenches or "deep" trenches. The first depth of the DT may provide, for example, a cavity for the co-integration of a semiconductor optical amplifier directly on the SiPhot die, and the second depth of the ST may be used, for example, for dicing lanes and optical coupling. The ST may also be used, for example, for compatibility with flip-chip process steps (such as metallization and bumping) that may be performed for the packaging of the SiPhot dies.

Figure 1:
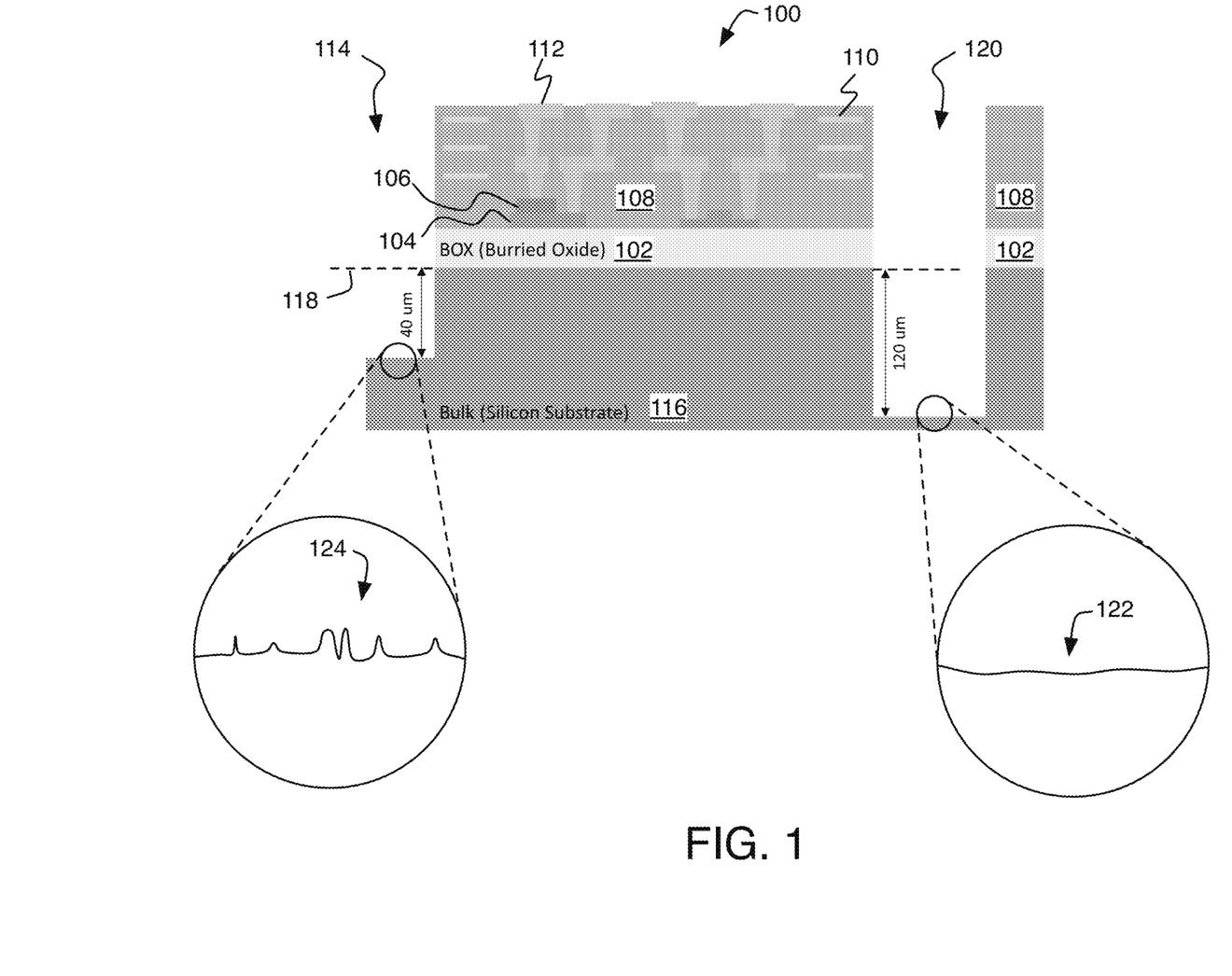
FIG. 1 is a cross-sectional view of a portion of a SiPhot die.

FIG. 1 shows an example of a portion 100 of a SiPhot device fabricated using etching rate selectivity techniques described herein. In this example, a SOI processing technique is used in which there is a BOX layer 102. In front-end-of-line (FEOL) processes, various structures, including photonic structures such as waveguides can be formed by etching and/or depositing material in any number of layers, such a structure 104 formed from etching Silicon deposited on top of the BOX layer 102 (or etching Silicon that has been grown or otherwise pre-formed during an SOI formation procedure to provide the Silicon as a top layer on top of the BOX layer in an initial SOI wafer), and a structure 106 formed from Germanium epitaxy. Between deposition of the various layers, additional Silicon dioxide 108 can be deposited surrounding the various structures and between various layers formed from various materials at different depths, such as structures 110 formed from Silicon Nitride (SiN). The Silicon dioxide 108 that is deposited has the same molecular composition as the Silicon dioxide that forms the BOX layer 102, but may have different material features such as a lower density and a more porous structure. In BEOL processes, structures can be formed including metal interconnects and pads, such as the structures 112 formed in this example using Aluminum. Additionally, the etching rate selectivity techniques, described in more detail below, have been used to form a shallow trench 114 etched into the (bulk) Silicon substrate 116 at first depth (e.g., 40 microns) below a bottom surface 118 of the BOX layer 102, and a deep trench 120 etched into the Silicon substrate 116 at a second depth (e.g., 120 microns) below the bottom surface 118 of the BOX layer 102. These trenches may have structural features 122, 124 that are characteristic of the etching rate selectivity techniques, as described in more detail below. In some cases, certain optical coupling structures, such as waveguides, can be formed in proximity to one or more of the trenches (e.g., with a core of the waveguide ending adjacent to a wall of the trench) to couple light between a device inserted into a trench and photonic circuitry within the SiPhot device.

Figure 2A:
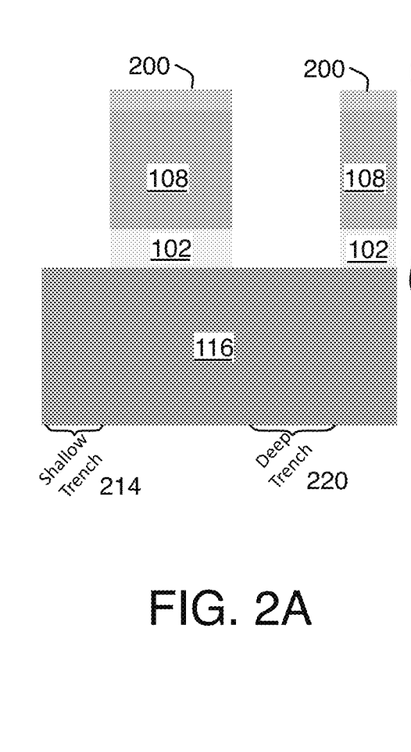
FIGS. 2A-2C are cross-sectional views of an example process flow.
Figure 2B:
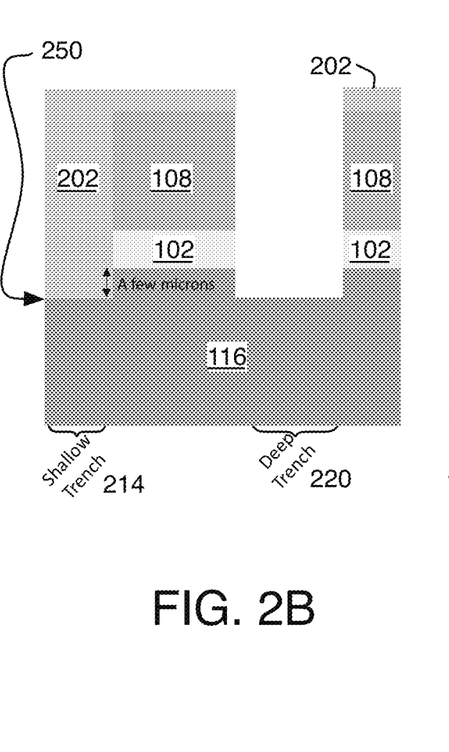
Figure 2C:
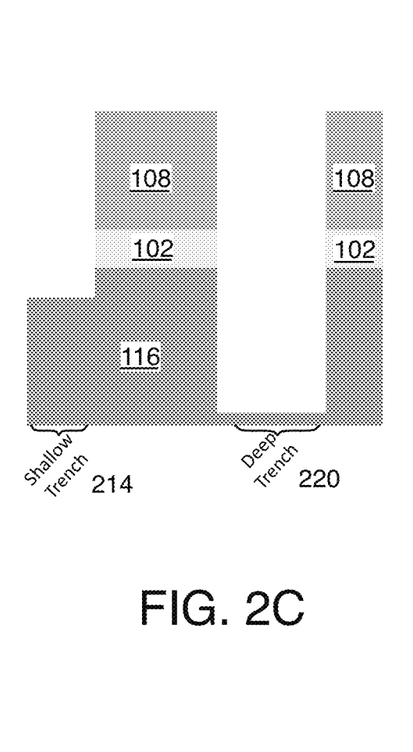

FIGS. 2A-2C illustrate an example of an alternative procedure to fabricate a SiPhot device that has trenches with different depths other than the etching rate selectivity techniques described herein. A first step (FIG. 2A) for forming the trenches includes selectively etching all the Silicon dioxide on top of the ST regions (including a shallow trench 214 and any other STs at that depth) and DT regions (including a deep trench 220 and any other DTs at that depth), down to the Silicon substrate 116. The selective etching can be performed using photoresist (PR) 200 deposited over all regions other than the ST regions and DT regions, which are being preserved. For example, the PR is first spun over the entire wafer, and then a mask can be used to expose PR over the ST regions and DT regions to UV light, enabling the exposed PR to be selectively removed. In a subsequent step (FIG. 2B), both the STs and the DTs are etched down to the ST depth 250, which in this example is a few microns below the bottom of the BOX layer 102. In a subsequent step (FIG. 2B), additional PR 202 is deposited over the STs and any other portions of the wafer other than the DT regions to be further etched. In a subsequent step, the DTs are etched to their full depth, resulting in the etched device shown in FIG. 2C.

Procedures such as this alternative procedure may limit the depth of the STs that may be achieved when using a standard spin coating process to deposit the PR all over the wafer. For example, if the thickness of the PR is limited to a few microns (e.g., less than 10 microns), then the depth of the STs may also be limited to a few microns so that the shallow trench depth is small enough to ensure that the top of the SiPhot dies are well covered by the PR. Also, spin-coating a PR on a topographical surface may also have practical limitations. For example, if cavities and other features (including the STs in this example) are present along the surface, the PR may fail to fill them properly, potentially leading to unintended exposed material that is not protected by PR. Moreover, topography may also result in uneven deposited film thicknesses over the wafer resulting in wrong pattern dimensions. Additionally, uneven PR thicknesses may be difficult to strip properly, which may cause PR residues in the ST areas.

Alternatives to spin-coating include spray-coating and dry film PR. However, such technologies may not be as widespread in CMOS foundries, and/or may be limited to dedicated foundries devoted to such specialized techniques as fabrication of micro-electro-mechanical systems (MEMS) and far-BEOL processes. Thus, these alternatives may not be CMOS compatible, which is useful for fabricating devices that have trenches of various depths for integration, such as devices in a SiPhot platform.

To address some or all of these limitations, the etching rate selectivity techniques described herein provide a fabrication process flow that enables the etching of two or more trenches with different depths. These techniques are based on the etching selectivity between a substrate material and a slow-etch material (e.g., the Silicon and Silicon dioxide, respectively, used in this example), where the slow-etch material has a slower etch rate than the substrate material for a given etching process. For example, the rate of the Silicon etching is typically ~100 times faster compared to the rate of the Silicon dioxide etching for typical etching processes (e.g., deep reactive ion etching, plasma etching, and wet etching, which may be at wafer level and by immersion). Using this etching rate selectivity (also called differential etch rates), a process can be used that enables the etching of both the STs and the DTs without the limitations described above being imposed on the depth of the STs.

Figure 3A:
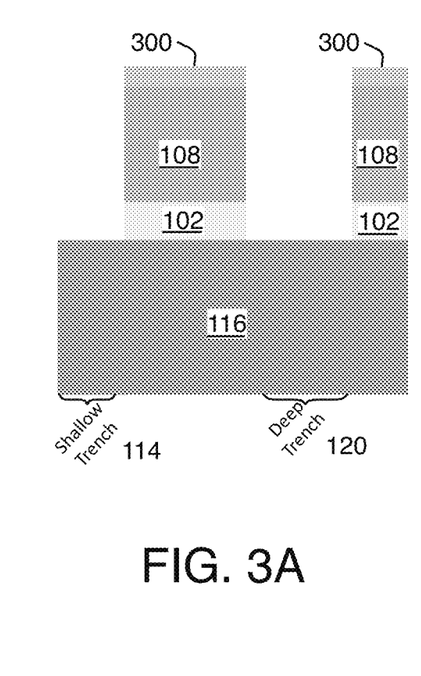
FIGS. 3A-3C are cross-sectional views of an example process flow.
Figure 3B:
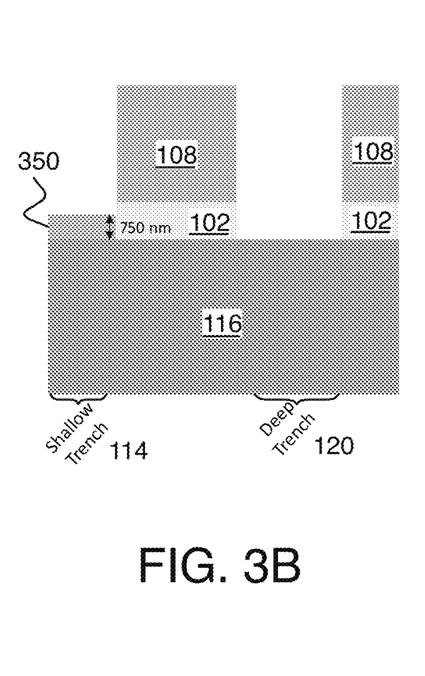
Figure 3C:
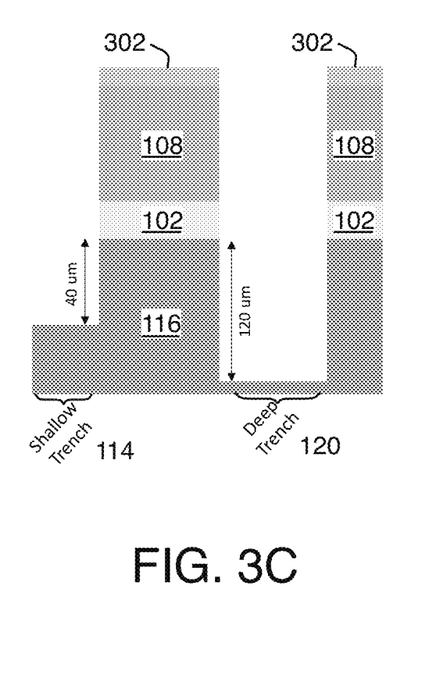
Figure 4A:
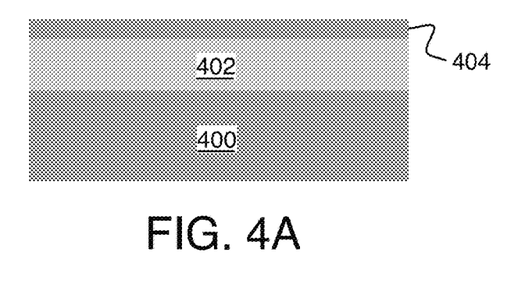
FIGS. 4A-4G are cross-sectional views of an example process flow.
Figure 4B:
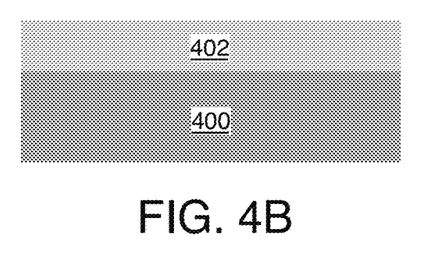
Figure 4C:
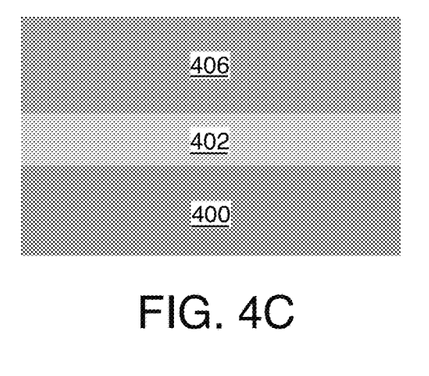
Figure 4D:
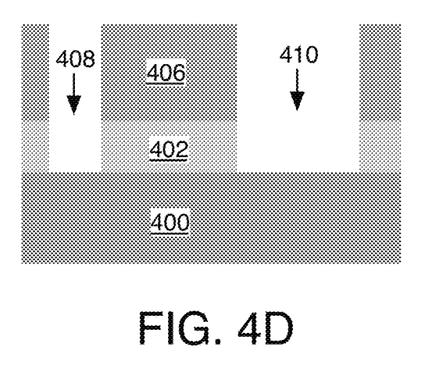
Figure 4E:
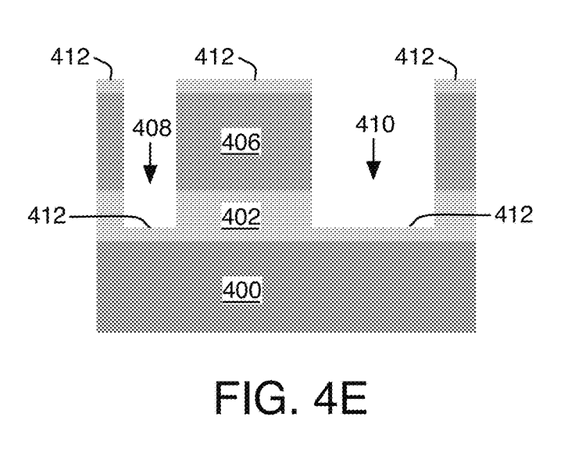
Figure 4F:
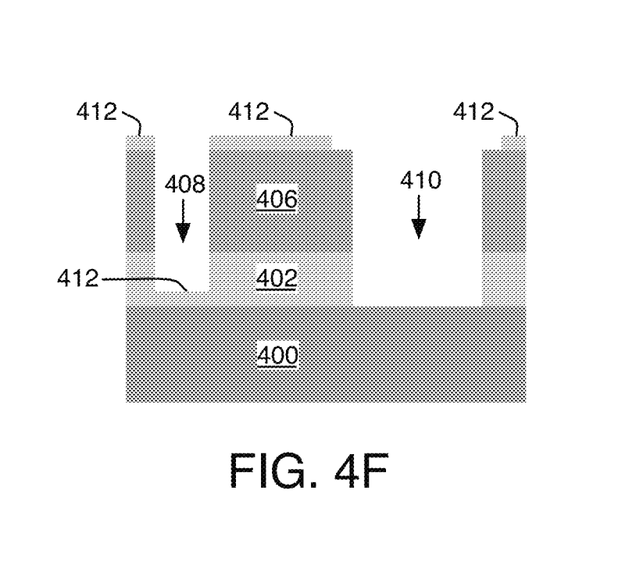
Figure 4G:
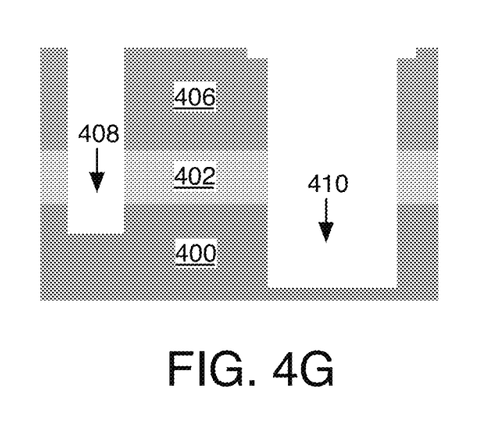

FIGS. 3A-3C illustrate an example of an etching rate selectivity procedure for forming trenches of varying depths. A first step (FIG. 3A) includes etching all the Silicon dioxide on top of the ST regions (including the shallow trench 114 and any other STs at that depth) and DT regions (including the deep trench 220 and any other DTs at that depth), down to the Silicon substrate 116. The selective etching can be performed using PR 300 that is selectively removed, as described above for FIG. 2A. In a subsequent step (FIG. 3B), a relatively thin slow-etch layer 350, composed of Silicon dioxide in this example, is deposited on top of the ST regions. The thickness of this slow-etch layer 350 (750 nm in this example) together with the etching selectivity of the material used for the slow-etch layer 350 will determine the ratio of the STs depth to the DTs depth. The precision used to achieve a desired thickness of the slow-etch layer may depend on the precision that is desired for the different trench depths. For example, if one of the trench depths calls for higher precision (e.g., due to a tighter tolerance on the target depth), then the simultaneous etching step can be monitored to stop based on that trench depth, and any variation in slow-etch layer thickness would result in variation in the other (non-monitored) trench depth. This may be acceptable since some trenches (e.g., trenches for dicing lanes) may not have tight tolerances on their depth. Alternatively, if both trench depths call for relatively high precision, then the slow-etch layer thickness can be controlled using a material and/or process that results in a more precise thickness. In subsequent steps (FIG. 3C), after a PR layer 302 is patterned to protect the non-trench regions, the etching of both the ST and the DT trenches are performed simultaneously. While the slow-etch layer will be etched slowly in the ST regions, the substrate will be etched rapidly in the DT regions. After the slow-etch layer in the ST regions is completely etched away, the substrate etching will continue in both the ST and DT areas with the same etching rate until a desired stopping point is reached, resulting in a device that achieves the desired trench depths (40 microns and 120 microns in this example for the ST 114 and DT 120, respectively). Referring back to FIG. 1, structural features 122, 124 may remain at the bottom surfaces of the various trenches that are characteristic of the etching rate selectivity procedure used to form the trenches. In this example, the deep trench 120 has a relatively smooth surface topography 122 and the shallow trench 114 has a relatively rough surface topography 124 compared to the roughness of the topography 122.

Compared to the alternative process flow described with reference to FIGS. 2A-2C, this etching rate selectivity technique can easily be adapted for the etching of more than two trenches with different depths. Furthermore, there are other ways to generate the slow-etch layer. For example, for achieving more than two different depths of trenches, multiple etching rate selectivity phases can be performed. A stop layer (e.g., using silicon nitride or another appropriate protective material) can be formed over the ST regions, deposited during the process on top of a given thickness of Silicon dioxide (e.g., BOX, pre-metal dielectric (PMD), inter-metal dielectric (IMD), or a combination). This protective stop layer can be used to keep a layer of Silicon dioxide to be used later as a slow-etch layer temporarily unetched on top of the ST areas so that it can be exploited during a subsequent etching rate selectivity phase after the stop layer is removed.

Additionally, materials other than Silicon dioxide can be used to form the slow-etch layer to control the STs depth including Silicon Nitride, Silicon Oxynitride, Silicon Carbonitride, or even PR using an appropriate technique for controlling the thickness of the PR (e.g., other than spinning an arbitrary thickness of PR). Since Silicon dioxide deposition is done at wafer level, it is patterned (e.g., using PR or other selective patterning procedures before and/or after deposition) to keep only the desired thickness of a slow-etch layer over the STs, removing the deposited Silicon dioxide elsewhere (as show in FIG. 3B). An alternative to depositing a thin layer of Silicon dioxide would be to use another material with slower etching rate than Silicon (or other substrate material if a different kind of photonic integrated circuit die was used other than a SiPhot die), such as a thin PR layer with a thickness between around 100-500 nm, depending on the type of PR used and the desired trench ratio. Using a PR layer could make the slow-etch layer deposition process more straightforward since the PR layer can be developed to remove the unwanted sections. In some implementations, a portion of the BOX layer 102 may be used to form the slow-etch layer by limiting removal of the BOX layer 102 over the ST regions, and completely removing the BOX layer 102 over the DT regions. Alternatively, different thicknesses of the BOX layer can be left to cover the ST regions and DT regions, with a thicker BOX layer remaining over the ST regions and a thinner BOX layer remaining over the DT regions.

FIGS. 4A-6G illustrate another example of an etching rate selectivity procedure for forming trenches of varying depths. In this example, two deep trenches are formed, each having a different depth. An initial state of a SOI wafer (FIG. 4A) includes a bulk Silicon substrate 400 (also called a handle layer or base layer), a BOX layer 402, and a SOI layer of Silicon 404 (also called a top layer or device layer). For example, the SOI wafer has the following characteristics in some implementations: a diameter of 200 mm, a bulk Silicon substrate thickness of 725 microns (±about 15 microns) and high resistivity of greater than about 750 ohm-cm, a BOX layer thickness of about 3 microns, and a SOI Silicon layer thickness of 220 nm and resistivity of 10 ohm-cm. A first step (FIG. 4B) includes etching away all of the SOI layer of Silicon 404 (e.g., using full sheet etching) since there will not be any patterned photonic circuits in this layer in this example (other examples may preserve some or all of the SOI layer of Silicon 404 on portions of the wafer). In a subsequent step (FIG. 4C), a layer of Silicon dioxide is deposited as an Inter Metal Dielectric (IMD) layer 406 (e.g., as in a SiPhot BOEL process). In a subsequent step (FIG. 4D), patterning produces a first DT region 408 and a second DT region 410 both initially etched to the same depth, which can use the bulk Silicon substrate 400 as an etch stop layer (ESL). In a subsequent step (FIG. 4E), a thin layer of Silicon dioxide 412 is deposited having an adapted thickness. The deposited thickness is tuned with respect to the different etch rates of Silicon and Silicon dioxide, and a targeted etch depth differences between the DT region 408 and the DT region 410. In a subsequent step (FIG. 4F), patterning is performed to locally remove Silicon dioxide at the bottom of the DT region 410 to expose the underlying Silicon substrate 400, but preserve the thin deposited layer of Silicon dioxide 412 at the bottom of the DT region 408. In a subsequent step (FIG. 4G), a selective Silicon etch is performed at the wafer level without photoresist to etch both the DT region 408 and the DT region 410 selectively due to the time needed to fully etch away the Silicon dioxide used as the slow-etch layer in the DT region 408 before continuing to etch Silicon in the DT region 408, compared to using the entire etch time for etching Silicon in the DT region 410.

Figure 5:
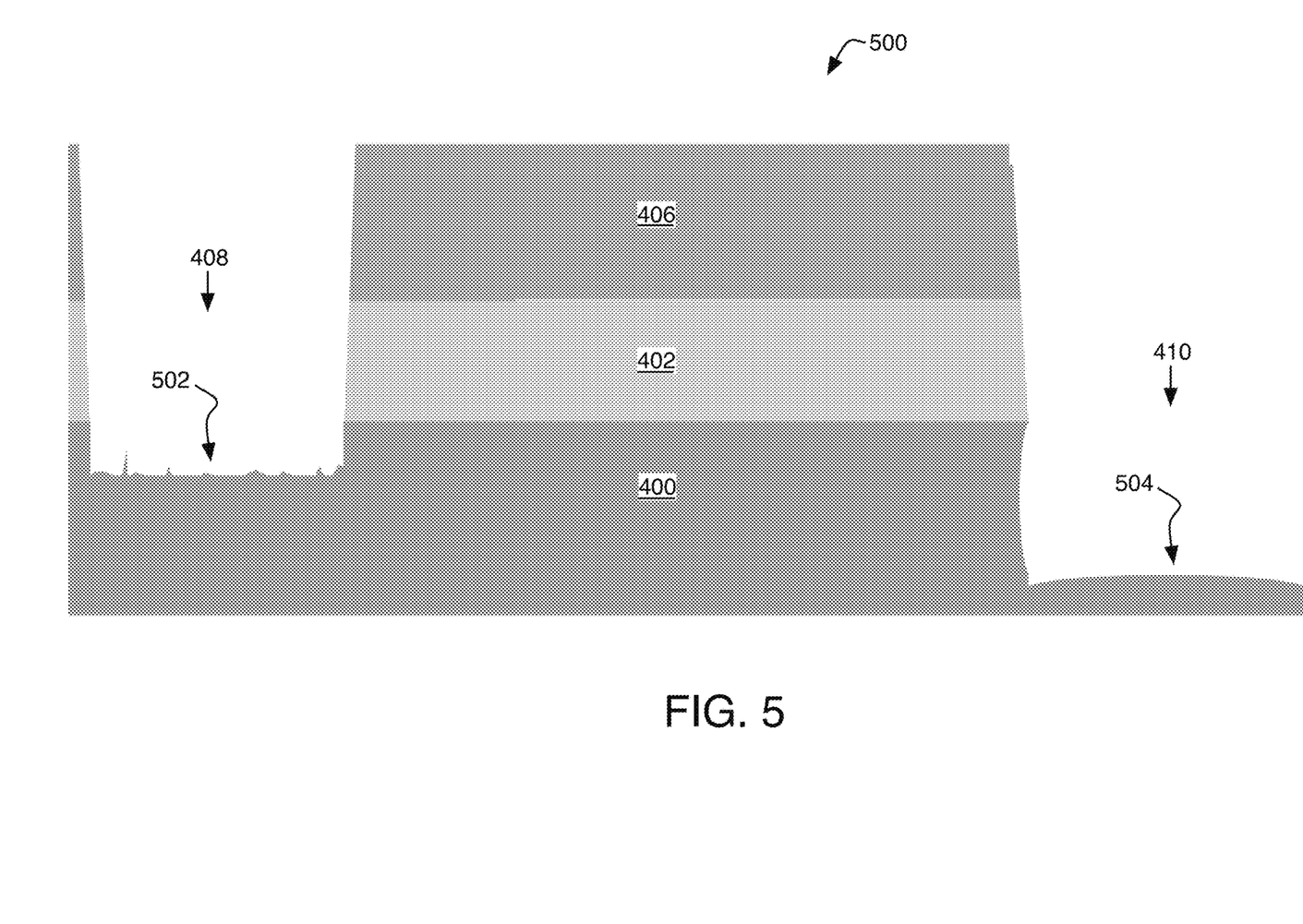
FIG. 5 is a cross-sectional view of a portion of an etched wafer.

FIG. 5 shows an example of a cross-sectional view of a portion 500 of the wafer fabricated using the etching rate selectivity procedure of FIGS. 4A-4G. There are structural features 502 and 504 that remain at the bottom surfaces of the DT region 408 and DT region 410, respectively, which are characteristic of the etching rate selectivity procedure used to form the trenches. In this example, the deeper of the two trench regions, DT region 410, has a relatively smooth surface topography 504 and the shallower of the two trench regions, DT region 408, has a relatively rough surface topography 502 compared to the roughness of the topography 504. The relatively rough surface topography 502 has been caused, for example, by micro-masking effect that occurs when the Silicon dioxide on top of the shallow trench has not been etched in a perfectly uniform manner, as described herein. There is also a difference in the sidewall profiles of the two trenches, as shown in FIG. 5.

Figure 6A:
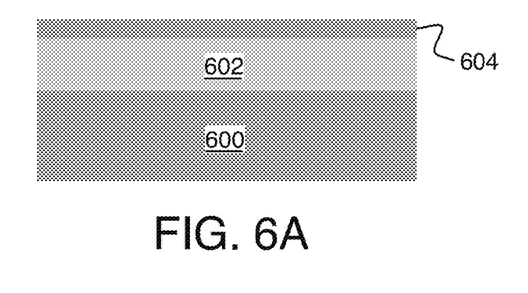
FIGS. 6A-6I are cross-sectional views of an example process flow.
Figure 6B:
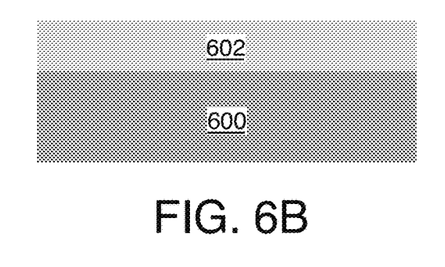
Figure 6C:
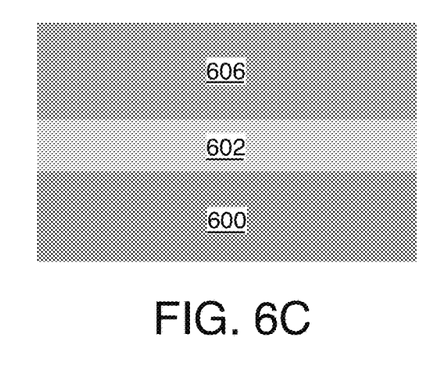
Figure 6D:
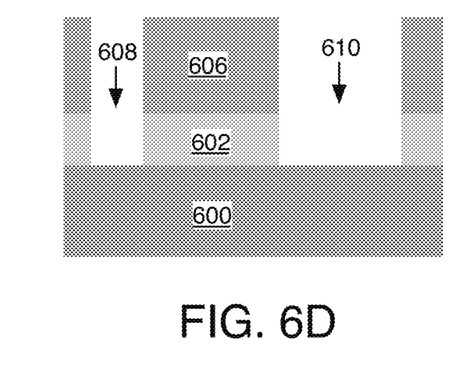
Figure 6E:
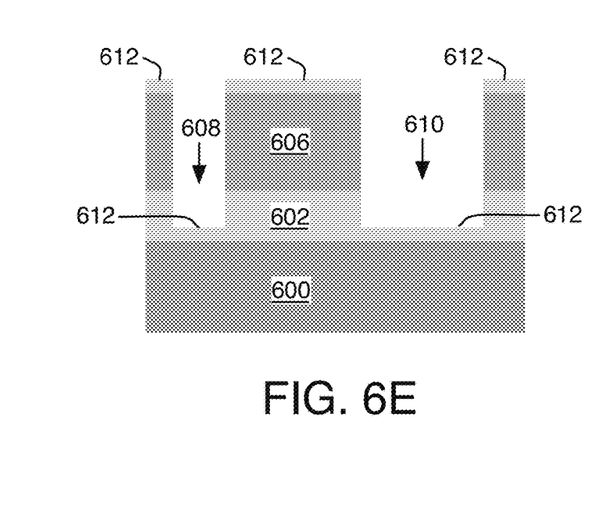
Figure 6F:
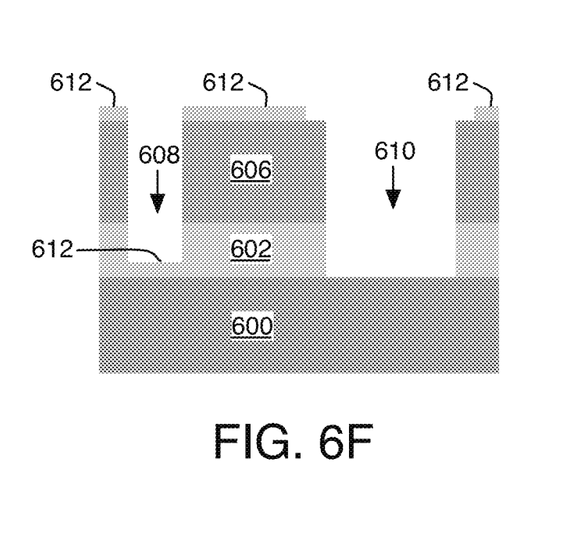
Figure 6G:
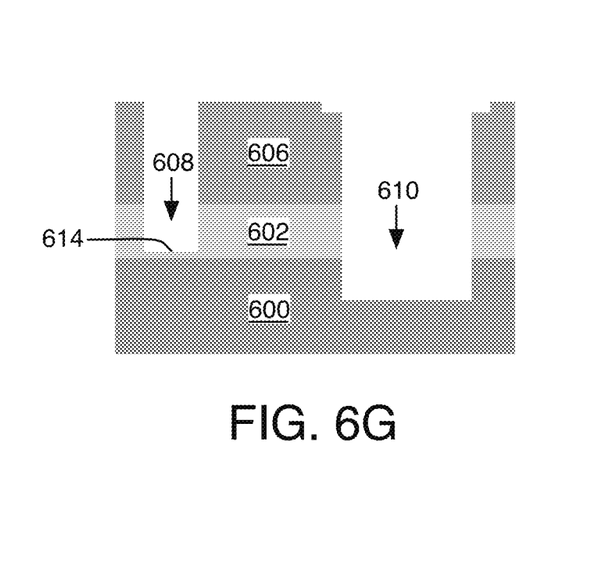
Figure 6H:
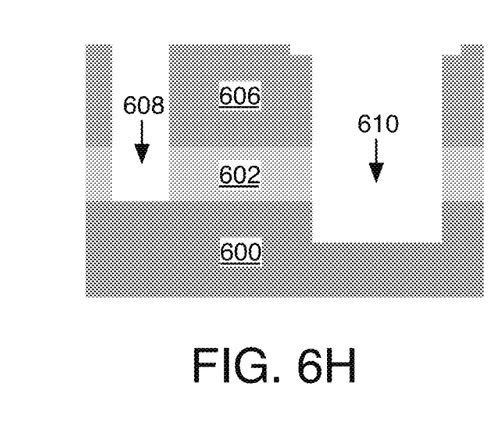
Figure 6I:
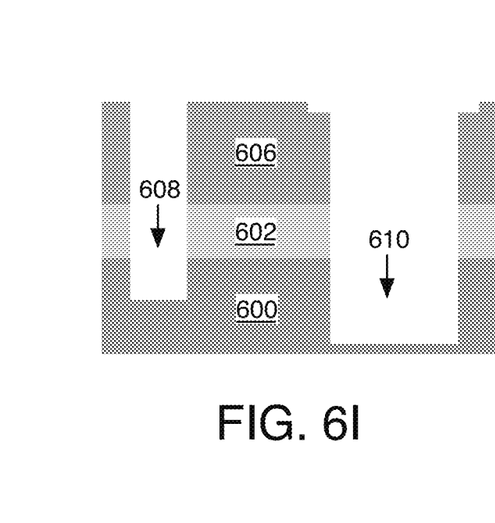

FIGS. 6A-6E illustrate another example of an etching rate selectivity procedure for forming trenches of varying depths. This is another example in which two deep trenches are formed, each having a different depth, but procedure that includes additional steps that help to reduce or eliminate micro-masking effects. An initial state of a SOI wafer (FIG. 6A) includes a bulk Silicon substrate 600, a BOX layer 602, and a SOI layer of Silicon 604. The SOI wafer has the same characteristics in this simplified procedure as in the full procedure. A first step (FIG. 6B) includes etching away all of the SOI layer of Silicon 604 (e.g., using full sheet etching). In a subsequent step (FIG. 6C), a 6.3-micron thick layer of Silicon dioxide is deposited as an Inter Metal Dielectric (IMD) layer 606. In a subsequent step (FIG. 6D), patterning produces a first DT region 608 and a second DT region 610 both initially etched to the same depth, which penetrate into the bulk Silicon substrate 600 to the same target depth, which corresponds to the target final depth of the first DT region 608 (e.g., around 50 microns). In a subsequent step (FIG. 6E), a thin layer of Silicon dioxide 612 is deposited having an adapted thickness. The deposited thickness is tuned with respect to the different etch rates of Silicon and Silicon dioxide, and a targeted etch depth differences between the DT region 608 and the DT region 610. In a subsequent step (FIG. 6F), patterning is performed to locally remove Silicon dioxide at the bottom of the DT region 610 to expose the underlying Silicon substrate 600, but preserve the deposited layer of Silicon dioxide 612 at the bottom of the DT region 608. In a subsequent step (FIG. 6G), a selective Silicon etch is performed at the wafer level without photoresist to etch both the DT region 608 and the DT region 610 selectively due to the time needed to partially etch the Silicon dioxide used as the slow-etch layer in the DT region 608 down to a thin Silicon dioxide layer 614, compared to using that etch time for etching Silicon in the DT region 610. In a subsequent step (6H), the remaining thin Silicon dioxide layer 614 is etched away in the DT region 608 using Silicon as a stop-layer, while the DT region 610 is further etched. In a subsequent step (6I), both regions are further etched using a time-fixed Silicon etching that achieves the target depths for both the DT region 608 and the DT region 610.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. An article of manufacture, comprising:
   one or more photonic structures formed within one or more layers over a surface of a substrate; and
   a plurality of trenches formed through the one or more layers with one or more of the trenches housing one or more devices coupled to one or more of the photonic structures, the plurality of trenches including:
   a first trench that has a bottom surface within the substrate that has a first surface topology characterized by a first surface roughness at a first depth within the substrate relative to the surface of the substrate, and
   a second trench that has a bottom surface within the substrate that has a second surface topology characterized by a second surface roughness at a second depth within the substrate relative to the surface of the substrate;
   where the first surface roughness is greater than the second surface roughness, and the second depth is greater than the first depth.

2. The article of manufacture of claim 1, where the first surface includes a first plurality of regions that have been etched more deeply than a second plurality of regions.

3. The article of manufacture of claim 1, where the substrate consists essentially of Silicon.

4. The article of manufacture of claim 1, where the one or more photonic structures comprise a plurality of photonic structures.

5. The article of manufacture of claim 1, where the one or more photonic structures comprise one or more waveguides.

6. The article of manufacture of claim 5, where at least one waveguide is formed in proximity to at least one of the first trench or the second trench.

7. The article of manufacture of claim 1, where at least one of the photonic structures is formed from etched Silicon deposited in a layer over the surface of the substrate.

8. The article of manufacture of claim 1, where at least one of the photonic structures is formed from Germanium epitaxy.

9. The article of manufacture of claim 1, where at least one of the photonic structures is formed from Silicon Nitride.

10. The article of manufacture of claim 1, where a first device is inserted into at least a portion of the second trench, and the first trench comprises at least one of: a dicing lane, an optical coupling surface, or a flip-chip structure.

11. The article of manufacture of claim 10, where the flip-chip structure comprises at least one of: one or more metallization layers or one or more bumping structures.

12. The article of manufacture of claim 10, where the first device comprises at least one of: a laser, an optical amplifier, an optical modulator, an optical filter, an optical isolator, or an optical circulator.

13. The article of manufacture of claim 10, where the first device is formed from at least one material that is different from the substrate.

14. The article of manufacture of claim 13, where the at least one material comprises lithium niobate or indium phosphide.

* * * * *